(12) United States Patent
Shi

(10) Patent No.: US 10,033,380 B2
(45) Date of Patent: Jul. 24, 2018

(54) CONTROL CIRCUIT AND TERMINAL

(71) Applicant: SANECHIPS TECHNOLOGY CO., LTD, Shenzhen (CN)

(72) Inventor: Qingwei Shi, Shenzhen (CN)

(73) Assignee: SANECHIPS TECHNOLOGY CO., LTD, Shenzhen (CN)

( * ) Notice: Subject to any disclaimer, the term of this patent is extended or adjusted under 35 U.S.C. 154(b) by 113 days.

(21) Appl. No.: 15/039,570

(22) PCT Filed: Nov. 7, 2014

(86) PCT No.: PCT/CN2014/090624
§ 371 (c)(1),
(2) Date: May 26, 2016

(87) PCT Pub. No.: WO2015/117436
PCT Pub. Date: Aug. 13, 2015

(65) Prior Publication Data
US 2017/0134021 A1    May 11, 2017

(30) Foreign Application Priority Data

Jul. 21, 2014  (CN) .................... 2014 2 0404386 U

(51) Int. Cl.
*H01H 35/14*    (2006.01)
*H01H 37/00*    (2006.01)
(Continued)

(52) U.S. Cl.
CPC ......... *H03K 17/941* (2013.01); *H03K 17/945* (2013.01)

(58) Field of Classification Search
CPC ....................... H03K 17/941; H03K 17/945
(Continued)

(56) References Cited

U.S. PATENT DOCUMENTS 5,463,333 A   10/1995 Calder
5,818,129 A   10/1998 Fericean
(Continued)

FOREIGN PATENT DOCUMENTS

CN      1211726 A    3/1999
CN    201699680 U    1/2011
(Continued)

OTHER PUBLICATIONS

International Search Report in international application No. PCT/CN2014/090624, dated Apr. 15, 2015.
(Continued)

*Primary Examiner* — Lincoln Donovan
*Assistant Examiner* — Metasebia Retebo
(74) *Attorney, Agent, or Firm* — Oppedahl Patent Law Firm LLC

(57) ABSTRACT

A control circuit and a terminal are provided. The control circuit includes a detector, a current-voltage conversion circuit and a control signal generation circuit. The current output end of the detector is connected with the current input end of the current-voltage conversion circuit. The voltage output end of the current-voltage conversion circuit is connected with the voltage input end of the control signal generation circuit. The signal input end of the control signal generation circuit outputs a control signal. The detector detects a state of motion of a detected object and generates at least one current signal according to the state of motion of the detected object. The current-voltage conversion circuit converts the at least one current signal transmitted by the detector to at least one voltage signal. The control signal generation circuit generates the control signal based on a variation rule of the at least one voltage signal transmitted by the current-voltage conversion circuit and a preset control signal generation strategy, and output the control signal.

10 Claims, 1 Drawing Sheet

(51) Int. Cl.
*H01H 47/24* (2006.01)
*H01H 47/26* (2006.01)
*H03K 17/94* (2006.01)
*H03K 17/945* (2006.01)

(58) Field of Classification Search
USPC .................................................... 307/117
See application file for complete search history.

(56) References Cited

U.S. PATENT DOCUMENTS

| | | | |
|---|---|---|---|
| 5,917,187 A | 6/1999 | Takata | |
| 8,878,774 B2 | 11/2014 | Kim | |
| 2005/0121602 A1 | 6/2005 | Peng | |
| 2005/0162115 A1 | 7/2005 | Pendergrass | |
| 2011/0102378 A1 | 5/2011 | Kim | |
| 2015/0310832 A1* | 10/2015 | Miyamoto | G09G 5/00 345/212 |

FOREIGN PATENT DOCUMENTS

| | | |
|---|---|---|
| CN | 102263547 A | 11/2011 |
| CN | 102598509 A | 7/2012 |
| EP | 2747288 A1 | 6/2014 |
| GB | 2263549 B | 4/1996 |
| JP | 2003101395 A | 4/2003 |
| WO | 2009031528 A1 | 3/2009 |

OTHER PUBLICATIONS

English Translation of the Written Opinion of the International Search Authority in international application No. PCT/CN2014/090624, dated Apr. 15, 2015.
Supplementary European Search Report in European application No. 14881529.3, dated Feb. 23, 2017.

\* cited by examiner

CONTROL CIRCUIT AND TERMINAL

TECHNICAL FIELD

The present disclosure relates to the technology of terminal control, and in particular to a control circuit and a terminal.

BACKGROUND

At present, the turning on and off of the screen of a terminal is implemented by a short press on a physical power key on the terminal. Nevertheless, for daily use, a user may frequently switch on and off the screen, even dozens of times a day. The power key would be pressed frequently. The surface of the power key will be abraded more rapidly, thereby destroying the appearance of the terminal. Further, the power key will be degraded more rapidly and will be easy to be damaged.

SUMMARY

In order the address the problems as described above, embodiments of the present disclosure are expected to provide a control circuit and a terminal, such that the abrasion and degradation of the power key may be slowed down, and the life time thereof may be extended.

The technical solution provided in the embodiments of the present disclosure may be implemented as follows.

For a first aspect, an embodiment of the disclosure provides a control circuit, which includes a detector, a current-voltage conversion circuit and a control signal generation circuit;

a current output end of the detector is connected with a current input end of the current-voltage conversion circuit; a voltage output end of the current-voltage conversion circuit is connected with a voltage input end of the control signal generation circuit, a signal output end of the control signal generation circuit outputs a control signal; wherein the detector is configured to detect a state of motion of an detected object;

generate at least one current signal according to the state of motion of the detected object and transmit the at least one current signal to the current-voltage conversion circuit;

the current-voltage conversion circuit is configured to convert the at least one current signal transmitted by the detector to at least one voltage signal, and transmit the at least one voltage signal to the control signal generator;

the control signal generator is configured to generate the control signal based on a preset control signal generation strategy and a variation rule of the at least one voltage signal transmitted by the current-voltage conversion circuit; and output the control signal.

In the technical solution as described above, the detector includes a first sensor and a second sensor, which are separated by a preset distance;

the first sensor is configured to detect the state of motion of the detected object at the first sensor and generate a first current signal corresponding to the state of motion of the detected object at the first sensor, wherein the first current signal is a first current which increases and then decreases; and configured to transmit the first current signal to a first current input end of the current-voltage conversion circuit through a first current output end;

the second sensor is configured to detect the state of motion of the detected object at the second sensor and generate a second current signal corresponding to the state of motion of the detected object at the second sensor, wherein the second current signal is a second current which increases and then decreases; a start time where the first current starts to vary and a start time where the second current starts to vary are separated by a first time interval; and configured to transmit the second current signal to a second current input end of the current-voltage conversion circuit through a second current output end.

In the above technical solution, the current-voltage conversion circuit may include a DC voltage source, a first triode, a first resistor, a second triode, a second resistor and grounding;

a base of the first triode is the first current input end, a collector of the first triode is the first voltage output end, and the collector of the first triode is connected with one end of the first resistor, the other end of the first resistor is connected with the DC voltage source, an emitter of the first triode is connected to the grounding:

a base of the second triode is the second current input end, a collector of the second triode is the second voltage output end, and the collector of the second triode is connected with one end of the second resistor, the other end of the second resistor is connected with the DC voltage source, an emitter of the second triode is connected to the grounding.

In the above technical solution, the control signal generation circuit includes a first voltage input end, a second voltage input signal, a signal generation circuit and a control signal output end, wherein the first voltage input end is connected with the first voltage output end, the second voltage input end is connected with the second voltage output end;

the signal generation circuit is configured to receive the first voltage signal through the first voltage input end, receive the second voltage signal through the second voltage input end, generate the control signal based on a difference between the first voltage signal and the second voltage signal and the preset control signal generation strategy, and output the control signal through the control signal output end.

In the above technical solution, the signal generation circuit is configured to:

when neither a time interval in which the first voltage signal increases from a low level to a high level and then decreases to the low level nor a time interval in which the second voltage signal increases from a low level to a high level and then decreases to the low level exceeds a first preset time interval, compare the first time interval with a second preset time interval, when the first time interval does not exceed the second preset time interval, generate the control signal;

when the first time interval is larger than the second preset time interval, generate no control signal.

In the above technical solution, the signal generation circuit is configured to generate a turn-on signal when the first time interval is positive and generate a turn-off signal when the first time interval is negative.

For a second aspect, an embodiment of the present disclosure provides a terminal, the terminal includes a switch for screen and a control circuit according to the first aspect, the control signal output end of the control circuit is connected with the switch for the screen of the terminal.

The embodiments of the present disclosure provide a control circuit and a terminal, which detect the state of motion of an detected object and generates a control signal to control the turning on and off of the screen of the terminal. Therefore, the abrasion and degradation of the power key may be slowed down, and the life time thereof may be extended.

DETAILED DESCRIPTION

The technical solution according to the embodiments of the present disclosure is described in a clear and complete manner in combination of the drawings of the embodiments of the present disclosure.

Figure 1:
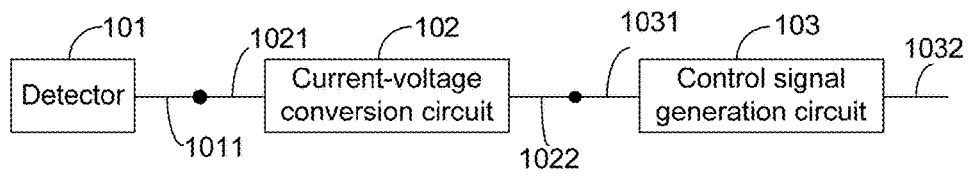
FIG. 1 is a diagram of a structure of a control circuit provided in an embodiment of the disclosure.

With reference to FIG. 1, a structure of a control circuit 10 provided in an embodiment of the present disclosure is shown. The control circuit 10 may include a detector 101, a current-voltage conversion circuit 102 and a control signal generation circuit 103.

A current output end 1011 of the detector 101 is connected with a current input end 1021 of the current-voltage conversion circuit 102. A voltage output end 1022 of the current-voltage conversion circuit 102 is connected with a voltage input end 1031 of the control signal generation circuit 103. A control signal is outputted through a signal input end 1032 of the control signal generation circuit 103, the detector 101 is configured to detect a state of motion of an detected object, and generate at least one current signal according to the state of motion of the detected object, and transmit the at least one current signal to the current-voltage conversion circuit 102;

the current-voltage conversion circuit 102 is configured to convert the at least one current signal transmitted by the detector 101 to at least one voltage signal and transmit the at least one voltage signal to the control signal generator 103;

the control signal generation circuit 103 is configured to generate the control signal based on a variation rule of the at least one voltage signal transmitted by the current-voltage conversion circuit 102 and a preset control signal generation strategy, and output the control signal.

Figure 2:
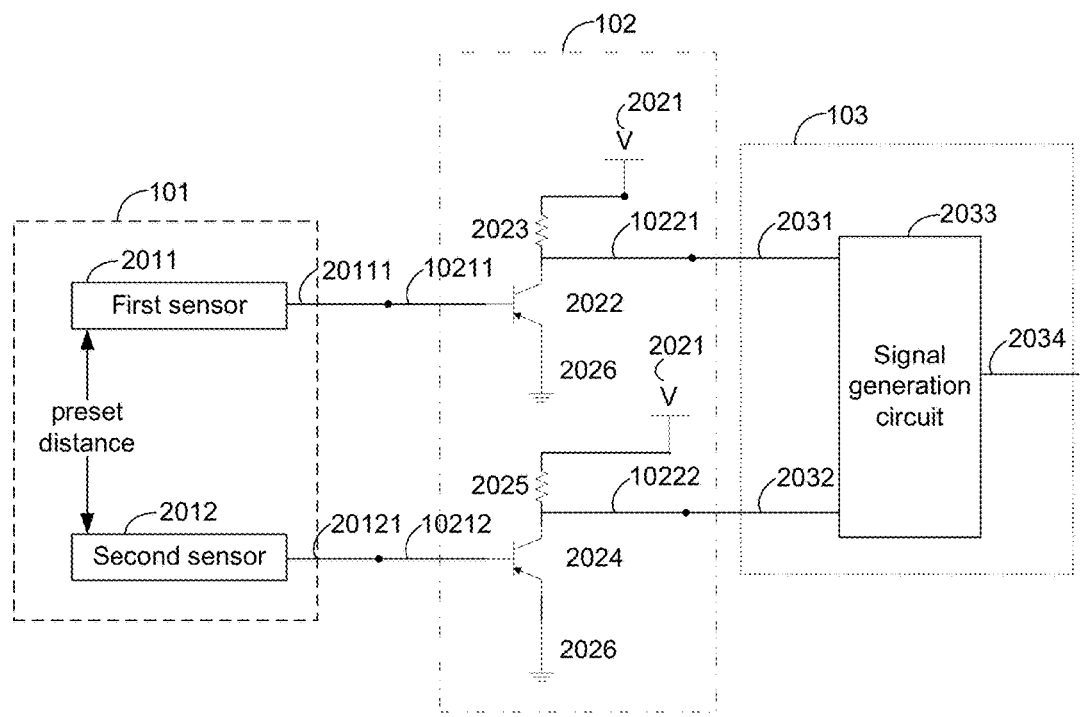
FIG. 2 is a diagram of a structure of another control circuit provided in an embodiment of the disclosure.

In an exemplary embodiment as shown in FIG. 2, the detector 101 may include a first sensor 2011 and a second sensor 2012, which are separated by a preset distance, the first sensor 2011 is configured to detect the state of motion of the detected object at the first sensor 2011, generate a first current signal corresponding to the state of motion of the detected object at the first sensor 2011, and transmit the first current signal to a first current input end 10211 of the current-voltage conversion circuit 102 through a first current output end 20111;

the second sensor 2012 is configured to detect the state of motion of the detected object at the second sensor 2012, generate a second current signal corresponding to the state of motion of the detected object at the second sensor 2012, and transmit the second current signal to a second current input end 10212 of the current-voltage conversion circuit 102 through a second current output end 20121.

Specifically, the first sensor 2011 and the second sensor 2012 may be infrared sensors and/or proximity sensors. In this embodiment, the detected object may be a hand of a user. According to a setting, when the hand of the user passes from the first sensor 2011 to the second sensor 2012, the first sensor 2011 may generate a first current signal according to the state of motion of the hand of the user, the first current signal being a first current which increases and then decreases.

After passing by the first sensor 2011, the hand of the user continues passing by the second sensor 2012. Similar to the first sensor 2011, the second sensor 2012 may generate a second current signal according to the state of motion of the hand of the user, the second current signal being a second current which increases and then decreases.

It takes time for the hand of the user to pass from the first sensor 2011 to the second sensor 2012. Therefore, the interval between a start time where the first current starts to vary and a start time where the second current starts to vary is a first time interval.

In one embodiment, the current-voltage conversion circuit 102 may respectively convert the first current signal and the second current signal to the first voltage signal and the second voltage signal according to a proportion. It is therefore appreciated that the current-voltage conversion circuit 102 may be substituted with a current-voltage converter or an integrated current-voltage conversion chip. However, as shown in FIG. 2, in order to reduce the complexity of circuits and reduce the cost of devices, the current-voltage conversion circuit 102 may include a DC voltage source 2021, a first triode 2022, a first resistor 2023, a second triode 2024, a second resistor 2024 and grounding 2026.

The base of the first triode 2022 is the first current input end 10211. The collector of the first triode 2022 is the first voltage input end 10221. The collector of the first triode 2022 is connected with one end of the first resistor 2023. The other and of the first resistor 2023 is connected with the DC voltage source 2021. The emitter of the first triode 2022 is connected to the grounding 2026.

The base of the second triode 2024 is the second current input end 10212. The collector of the second triode 2024 is the second voltage output end 10222. The collector of the second triode 2024 is connected with one end of the second resistor 2025. The other end of the second resistor 2025 is connected with the DC voltage source 2021. The emitter of the second triode 2024 is connected to the grounding 2026.

Specifically, according to the principle of circuit, after the first current signal is inputted to the first triode 2022 through the first current input end 10211, the collector of the first triode 2022 outputs a first voltage signal corresponding to the first current signal. In this embodiment, the first current signal may be a first current which increases and then decreases. Therefore, the first voltage signal may be a first voltage which increases and then decreases.

According to the principle of circuit, after the second current signal is inputted to the second triode 2024 through the second current input end 10212, the collector of the second triode 2024 may output a second voltage signal corresponding to the second current signal. In this embodiment, the second current signal may be a second current which increases and then decreases. Therefore, the second voltage signal may be a second voltage which increases and then decreases.

It is appreciated that, similar to the first current and the second current, the interval between the start time where the first voltage starts to vary and the start time where the second voltage starts to vary is a first time interval.

In one embodiment as shown in FIG. 2, the control signal generation circuit 103 may include a first voltage input end 2031, a second voltage input end 2032, a signal generation circuit 2033 and a control signal output end 2034, wherein the first voltage input end 2031 is connected with the first voltage output end 10221, the second voltage input end 2032 is connected with the second voltage output end 10222;

the signal generation circuit 2033 is configured to receive the first voltage signal through the first voltage input end 2031, receive the second voltage signal through the second voltage input end 2032, generate the control signal based on a difference between the first voltage signal and the second voltage signal and the preset control signal generation strategy, and output the control signal through the control signal output end 2034.

Specifically, the signal generation circuit 2033 is configured to:

when both a time interval in which the first voltage signal and the second voltage signal increases from a low level to a high level and then decreases to the low level and a time interval in which the second voltage signal and the second voltage signal increases from a low level to a high level and then decreases to the low level do not exceed a first preset time interval, compare the first time interval with a second preset time interval, when the first time interval does not exceed the second preset time interval, generate the control signal;

when the first time interval is larger than the second preset time interval, not generate the control signal.

It should be understood that, in this embodiment, in the case that the first voltage signal and the second voltage signal does not accomplish the variation procedure of increasing and then decreasing, the first sensor or the second sensor is considered as being shielded for a long time, which indicates that no control signal has to be generated. For example, when a terminal is shielded, it is not necessary to turn on or off the screen of the terminal.

Therefore, in the case that both the first voltage signal and the second voltage signal accomplish the variation procedure of increasing and then decreasing, it indicates that a hand passed by the first sensor and the second sensor. The signal generation circuit 2033 needs to compare the first time interval with a second time interval to determine whether it is a misoperation of the user when the hand of the user passes by the first sensor and the second sensor. After determining that it is not the misoperation of the user, the signal generation circuit 2033 generates a control signal.

More specifically, since there is an interval between the start time where the first voltage starts to vary and the start time where the second voltage starts to vary, a positive interval indicates that the hand of the user passes by the second sensor from the first sensor, and a negative interval indicates that the hand of the user passes by the first sensor from the second sensor. The positive and negative Intervals may correspond to different control signals. The signal generation circuit 2033 is configured to generate a start signal when the first time interval is positive and generate a close signal when the first time interval is negative.

It is understood that the signal generation circuit 2033 may be implemented by a programmable chip and its peripheral circuit. It may also be implemented by a limited number of logic circuit devices such as triggers, timers and Not-or-AND (NAND) gates to form a specific signal generation circuit. This embodiment does not specifically define the form of implementation of the signal generation circuit.

In practical applications, each of the detector 101, the current-voltage conversion circuit 102 and the control signal generation circuit 103 may be implemented by a Central Processing Unit (CPU), a Digital Signal Processor (DSP), a Micro-Processor Unit (MPU) or a Field-Programmable Gate Array (FPGA) built in the terminal.

Figure 3:
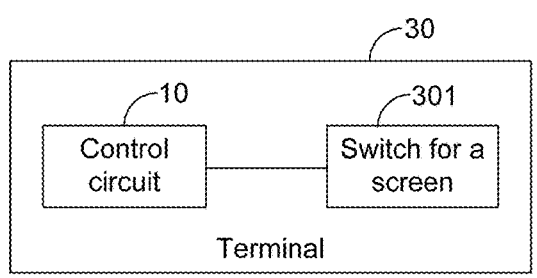
FIG. 3 is a diagram of a structure of a terminal provided in an embodiment of the disclosure.

FIG. 3 shows a terminal 30 according to an embodiment of the present disclosure. The terminal 30 includes the control circuit 10 as described in the above embodiments and a switch 301 for a screen. The control signal output end of the control circuit 10 is connected with the switch 301 for the screen of the terminal 30, such that the switch for screen 301 turns on or off the screen of the terminal according to the control signal outputted by the control signal output end of the control circuit 10.

Those skilled in the art will appreciate that the embodiments of the present disclosure may be provided as methods, systems or computer program products. The present disclosure may take the form of a hardware embodiment, a software embodiment or an embodiment combining software and hardware aspects. Further, the present disclosure may take the form of a computer program product which is embodied on one or more computer-usable storage media (including, but not limited to, disk storage, optical storage and so forth) having computer-usable program code embodied therein.

The present disclosure has been described with reference to flow diagrams and/or block diagrams of methods, apparatus (systems) and computer program products according to embodiments of the disclosure. It will be understood that each flow and/or block of the flow diagrams and/or block diagrams, and combinations of flows and/or blocks in the flow diagrams and/or block diagrams, can be implemented by computer program instructions. These computer program instructions may be provided to a processor of a general purpose computer, special purpose computer, embedded processor or other programmable data processing apparatus to produce a machine, such that the instructions, which are executed by the processor of the computer or other programmable data processing apparatus, create means for implementing the functions specified in the flow diagram flow or flows and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flow diagram flow or flows and/or block diagram block or blocks.

The computer program instructions may also be loaded onto a computer or other programmable data processing apparatus to cause a series of operational steps to be performed on the computer or other programmable apparatus to produce a computer implemented process, such that the instructions which execute on the computer or other programmable apparatus provide steps for implementing the functions specified in the flow diagram flow or flows and/or block diagram block or blocks.

The above descriptions are merely the preferred embodiments of the present disclosure, but not to limit the scope of protection of the present disclosure.

The invention claimed is:

1. A control circuit, comprising: a detector, a current-voltage conversion circuit and a control signal generation circuit; wherein
a current output end of the detector is connected with a current input end of the current-voltage conversion circuit; a voltage output end of the current-voltage conversion circuit is connected with a voltage input end of the control signal generation circuit, a signal output end of the control signal generation circuit outputs a control signal; wherein the detector is configured to detect a state of motion of a detected object, generate at least one current signal according to the state of motion of the detected object and transmit the at least one current signal to the current-voltage conversion circuit;

the current-voltage conversion circuit is configured to convert the at least one current signal transmitted by the detector to at least one voltage signal, and transmit the at least one voltage signal to the control signal generator;

the control signal generator is configured to generate the control signal based on a preset control signal generation strategy and a variation rule of the at least one voltage signal transmitted by the current-voltage conversion circuit, and output the control signal;

wherein the detector comprises a first sensor and a second sensor, which are separated by a preset distance; wherein the first sensor is configured to detect the state of motion of the detected object at the first sensor and generate a first current signal corresponding to the state of motion of the detected object at the first sensor, wherein the first current signal is a first current which increases and then decreases; and configured to transmit the first current signal to a first current input end of the current-voltage conversion circuit through a first current output end; and the second sensor is configured to detect the state of motion of the detected object at the second sensor and generate a second current signal corresponding to the state of motion of the detected object at the second sensor, wherein the second current signal is a second current which increases and then decreases, a start time where the first current starts to vary and a start time where the second current starts to vary are separated by a first time interval; and configured to transmit the second current signal to a second current input end of the current-voltage conversion circuit through a second current output end.

2. The control circuit according to claim 1, wherein the current-voltage conversion circuit comprises a direct current (DC) voltage source, a first triode, a first resistor, a second triode, a second resistor and a grounding;

a base of the first triode is the first current input end, a collector of the first triode is a first voltage output end, and the collector of the first triode is connected with one end of the first resistor, the other end of the first resistor is connected with the DC voltage source, an emitter of the first triode is connected to the grounding;

a base of the second triode is the second current input end, a collector of the second triode is a second voltage output end, and the collector of the second triode is connected with one end of the second resistor, the other end of the second resistor is connected with the DC voltage source, an emitter of the second triode is connected to the grounding.

3. The control circuit according to claim 2, wherein the control signal generation circuit comprises a first voltage input end, a second voltage input end, a signal generation circuit and a control signal output end, and wherein the first voltage input end is connected with the first voltage output end, the second voltage input end is connected with the second voltage output end;

the signal generation circuit is configured to receive a first voltage signal through the first voltage input end, receive a second voltage signal through the second voltage input end, generate the control signal based on a difference between the first voltage signal and the second voltage signal and the preset control signal generation strategy, and output the control signal through the control signal output end.

4. The control circuit according to claim 3, wherein the signal generation circuit is configured to:

when neither a time interval in which the first voltage signal increases from a low level to a high level and then decreases to the low level nor a time interval in which the second voltage signal increases from a low level to a high level and then decreases to the low level exceeds a first preset time interval, compare the first time interval with a second preset time interval, when the first time interval does not exceed the second preset time interval, generate the control signal;

when the first time interval is larger than the second preset time interval, not generate the control signal.

5. The control circuit according to claim 4, wherein the signal generation circuit is configured to generate a turn-on signal when the first time interval is positive and generate a turn-off signal when the first time interval is negative.

6. A terminal, comprising a switch for a screen and a control circuit, the control circuit comprising: a detector, a current-voltage conversion circuit and a control signal generation circuit; wherein a current output end of the detector is connected with a current input end of the current-voltage conversion circuit; a voltage output end of the current-voltage conversion circuit is connected with a voltage input end of the control signal generation circuit, a signal output end of the control signal generation circuit outputs a control signal; wherein the detector is configured to detect a state of motion of a detected object, generate at least one current signal according to the state of motion of the detected object and transmit the at least one current signal to the current-voltage conversion circuit;

the current-voltage conversion circuit is configured to convert the at least one current signal transmitted by the detector to at least one voltage signal, and transmit the at least one voltage signal to the control signal generator;

the control signal generator is configured to generate the control signal based on a preset control signal generation strategy and a variation rule of the at least one voltage signal transmitted by the current-voltage conversion circuit, and output the control signal, wherein a control signal output end of the control circuit is connected with the switch for the screen of the terminal;

wherein the detector comprises a first sensor and a second sensor, which are separated by a preset distance; wherein the first sensor is configured to detect the state of motion of the detected object at the first sensor and generate a first current signal corresponding to the state of motion of the detected object at the first sensor, wherein the first current signal is a first current which increases and then decreases; and configured to transmit the first current signal to a first current input end of the current-voltage conversion circuit through a first current output end; and the second sensor is configured to detect the state of motion of the detected object at the second sensor and generate a second current signal corresponding to the state of motion of the detected object at the second sensor, wherein the second current signal is a second current which increases and then decreases, a start time where the first current starts to vary and a start time where the second current starts to vary are separated by a first time interval; and configured to transmit the second current signal to a second current input end of the current-voltage conversion circuit through a second current output end.

7. The control circuit according to claim 6, wherein the current-voltage conversion circuit comprises a direct current (DC) voltage source, a first triode, a first resistor, a second triode, a second resistor and a grounding;
a base of the first triode is the first current input end, a collector of the first triode is a first voltage output end, and the collector of the first triode is connected with one end of the first resistor, the other end of the first resistor is connected with the DC voltage source, an emitter of the first triode is connected to the grounding;
a base of the second triode is the second current input end, a collector of the second triode is a second voltage output end, and the collector of the second triode is connected with one end of the second resistor, the other end of the second resistor is connected with the DC voltage source, an emitter of the second triode is connected to the grounding.

8. The control circuit according to claim 7, wherein the control signal generation circuit comprises a first voltage input end, a second voltage input end, a signal generation circuit and a control signal output end, and wherein the first voltage input end is connected with the first voltage output end, the second voltage input end is connected with the second voltage output end;
the signal generation circuit is configured to receive a first voltage signal through the first voltage input end, receive a second voltage signal through the second voltage input end, generate the control signal based on a difference between the first voltage signal and the second voltage signal and the preset control signal generation strategy, and output the control signal through the control signal output end.

9. The control circuit according to claim 8, wherein the signal generation circuit is configured to:
when neither a time interval in which the first voltage signal increases from a low level to a high level and then decreases to the low level nor a time interval in which the second voltage signal increases from a low level to a high level and then decreases to the low level exceeds a first preset time interval, compare the first time interval with a second preset time interval,
when the first time interval does not exceed the second preset time interval, generate the control signal;
when the first time interval is larger than the second preset time interval, not generate the control signal.

10. The control circuit according to claim 9, wherein the signal generation circuit is configured to generate a turn-on signal when the first time interval is positive and generate a turn-off signal when the first time interval is negative.

* * * * *